(12) United States Patent
Todd et al.

(10) Patent No.: US 7,285,500 B2
(45) Date of Patent: Oct. 23, 2007

(54) THIN FILMS AND METHODS OF MAKING THEM

(75) Inventors: Michael A. Todd, Phoenix, AZ (US); Ivo Raaijmakers, Bilthoven (NL)

(73) Assignee: ASM America, Inc., Phoenix, AZ (US)

( * ) Notice: Subject to any disclaimer, the term of this patent is extended or adjusted under 35 U.S.C. 154(b) by 57 days.

(21) Appl. No.: 11/179,256

(22) Filed: Jul. 12, 2005

(65) Prior Publication Data

US 2005/0250302 A1 Nov. 10, 2005

Related U.S. Application Data

(62) Division of application No. 10/074,564, filed on Feb. 11, 2002, now Pat. No. 6,962,859.

(60) Provisional application No. 60/340,454, filed on Dec. 7, 2001, provisional application No. 60/333,724, filed on Nov. 28, 2001, provisional application No. 60/332,696, filed on Nov. 13, 2001, provisional application No. 60/323,649, filed on Sep. 19, 2001, provisional application No. 60/311,609, filed on Aug. 9, 2001, provisional application No. 60/279,256, filed on Mar. 27, 2001, provisional application No. 60/268,337, filed on Feb. 12, 2001.

(51) Int. Cl.
*H01L 21/31* (2006.01)

(52) U.S. Cl. ......................... 438/758; 438/767

(58) Field of Classification Search ........ 438/758–784, 438/787–795
See application file for complete search history.

(56) References Cited

U.S. PATENT DOCUMENTS 3,900,597 A * 8/1975 Chruma et al. ............. 438/488

| 4,363,828 | A | 12/1982 | Brodsky et al. |
| 4,495,218 | A | 1/1985 | Azuma et al. |
| 4,585,671 | A | 4/1986 | Kitagawa et al. |
| 4,684,542 | A | 8/1987 | Jasinski et al. |

(Continued)

FOREIGN PATENT DOCUMENTS

EP 0 368 651 5/1990

(Continued)

OTHER PUBLICATIONS

Ikoma et al., Growth of Si/3c-SiC/Si(100) hetrostructures by pulsed supersonic free jets, Applied Physics Letters, vol. 75, No. 25, pp. 3977-3979, Dec. 1999.

(Continued)

*Primary Examiner*—Brook Kebede
(74) *Attorney, Agent, or Firm*—Knobbe, Martens, Olson & Bear, LLP

(57) ABSTRACT

Thin, smooth silicon-containing films are prepared by deposition methods that utilize a silicon containing precursor. In preferred embodiments, the methods result in Si-containing films that are continuous and have a thickness of about 150 Å or less, a surface roughness of about 5 Å rms or less, and a thickness non-uniformity of about 20% or less. Preferred silicon-containing films display a high degree of compositional uniformity when doped or alloyed with other elements. Preferred deposition methods provide improved manufacturing efficiency and can be used to make various useful structures such as wetting layers, HSG silicon, quantum dots, dielectric layers, anti-reflective coatings (ARC's), gate electrodes and diffusion sources.

8 Claims, 11 Drawing Sheets

U.S. PATENT DOCUMENTS

| | | | |
|---|---|---|---|
| 5,214,002 A | 5/1993 | Hayashi et al. |
| 5,227,329 A | 7/1993 | Kobayashi et al. |
| 5,356,821 A | 10/1994 | Naruse et al. |
| 5,389,398 A | 2/1995 | Suzuki et al. |
| 5,389,570 A | 2/1995 | Shiozawa |
| 5,453,858 A | 9/1995 | Yamazaki |
| 5,471,330 A | 11/1995 | Sarma |
| 5,591,494 A | 1/1997 | Sato et al. |
| 5,607,724 A | 3/1997 | Beinglass et al. |
| 5,614,257 A | 3/1997 | Beinglass et al. |
| 5,648,293 A | 7/1997 | Yayama et al. |
| 5,656,531 A | 8/1997 | Thakur et al. |
| 5,695,819 A | 12/1997 | Beinglass et al. |
| 5,698,771 A | 12/1997 | Shields et al. |
| 5,700,520 A | 12/1997 | Beinglass et al. |
| 5,786,027 A | 7/1998 | Rolfson |
| 5,789,030 A | 8/1998 | Rolfson |
| 5,837,580 A | 11/1998 | Thakur et al. |
| 5,849,601 A | 12/1998 | Yamazaki |
| 5,874,129 A | 2/1999 | Beinglass et al. |
| 5,876,797 A | 3/1999 | Beinglass et al. |
| 5,885,869 A | 3/1999 | Turner et al. |
| 5,959,326 A | 9/1999 | Aiso et al. |
| 6,027,705 A | 2/2000 | Kitsuno et al. |
| 6,083,810 A | 7/2000 | Obeng et al. |
| 6,103,600 A | 8/2000 | Ueda et al. |
| 6,159,828 A | 12/2000 | Ping et al. |
| 6,161,498 A | 12/2000 | Toraguchi et al. |
| 6,171,662 B1 | 1/2001 | Nakao |
| 6,197,669 B1 | 3/2001 | Twu et al. |
| 6,197,694 B1 | 3/2001 | Beinglass |
| 6,228,181 B1 | 5/2001 | Yamamoto et al. |
| 6,252,295 B1 | 6/2001 | Cote et al. |
| 6,326,311 B1 | 12/2001 | Ueda et al. |
| 6,385,020 B1 | 5/2002 | Shin et al. |
| 6,455,892 B1 | 9/2002 | Okuno et al. |
| 6,613,695 B2 | 9/2003 | Pomarede et al. |
| 6,821,825 B2 | 11/2004 | Todd et al. |
| 2002/0098627 A1 | 7/2002 | Pomarede et al. |

FOREIGN PATENT DOCUMENTS

| | | |
|---|---|---|
| EP | 0486047 A2 | 5/1992 |
| EP | 0747974 A2 | 12/1996 |
| EP | 1065728 A2 | 1/2001 |
| GB | 2332564 A | 6/1999 |
| JP | 57209810 A | 12/1982 |
| JP | 59078918 A | 5/1984 |
| JP | 59078919 A | 5/1984 |
| JP | 60043485 A | 3/1985 |
| JP | S60-43485 | 3/1985 |
| JP | 61153277 A | 7/1986 |
| JP | 62076612 A | 4/1987 |
| JP | 63003414 A | 1/1988 |
| JP | 63003463 A | 1/1988 |
| JP | 01217956 A | 8/1989 |
| JP | 01268064 A | 10/1989 |
| JP | 02155225 A | 6/1990 |
| JP | H 02-155225 | 6/1990 |
| JP | 03091239 A | 4/1991 |
| JP | H3-91239 | 4/1991 |
| JP | 03185817 A | 8/1991 |
| JP | 03187215 A | 8/1991 |
| JP | H3-185817 | 8/1991 |
| JP | H3-187215 | 8/1991 |
| JP | 03292741 A | 12/1991 |
| JP | 04323834 A | 11/1992 |
| JP | 05021378 A | 1/1993 |
| JP | 05062911 A | 3/1993 |
| JP | H5-62811 | 3/1993 |
| JP | 07249618 A | 9/1995 |
| JP | 08242006 | 9/1996 |
| JP | 11317530 | 11/1999 |

OTHER PUBLICATIONS

Olivares, J. et al.; "Solid-phase crystallization of amorphous SiGe films deposited by LPCVD on SiO2 and glass," Thin Solid Films 337 (1999) pp. 51-54.

* cited by examiner

1

THIN FILMS AND METHODS OF MAKING THEM

RELATED APPLICATION INFORMATION

This application is a divisional of U.S. patent application Ser. No. 10/074,564, filed Feb. 11, 2002, now U.S. Pat. No. 6,962,859, which claims priority to U.S. Provisional Application No. 60/268,337, filed Feb. 12, 2001; U.S. Provisional Application No. 60/279,256, filed Mar. 27, 2001; U.S. Provisional Application No. 60/311,609, filed Aug. 9, 2001; U.S. Provisional Application No. 60/323,649, filed Sep. 19, 2001; U.S. Provisional Application No. 60/332,696, filed Nov. 13, 2001; U.S. Provisional Application No. 60/333,724, filed Nov. 28, 2001; and U.S. Provisional Application No. 60/340,454, filed Dec. 7, 2001; all of which are hereby incorporated by reference in their entireties. This application is related to, and incorporates by reference in their entireties, U.S. patent application Ser. No. 10/074,563 (now U.S. Pat. No. 6,821,825); Ser. No. 10/074,149 (now U.S. Pat. No. 6,716,751); Ser. Nos. 10/074,722; 10/074,633; and 10/074,534, all of which were filed on Feb. 11, 2002.

BACKGROUND OF THE INVENTION

1. Field of the Invention

This invention relates generally to the deposition of silicon-containing films, and more particularly to the use of trisilane, $Si_3H_8$, in chemical vapor deposition processes for the deposition of thin silicon-containing films on various substrates.

2. Description of the Related Art

Silane ($SiH_4$) is widely used in the semiconductor manufacturing industry to deposit silicon-containing ("Si-containing") films by chemical vapor deposition (CVD). However, the deposition of very thin (e.g., about 150 Å or less) silicon-containing films using silane is very challenging, particularly over large area substrates. Very thin Si-containing films deposited using silane are often not continuous, due to an island-like film nucleation process, or have very rough surfaces due to the coalescence of island-like nuclei. In addition, the elemental composition of doped thin films is often not homogeneous in the cross-film and/or through-film directions because of differences in relative incorporation rates of the dopant elements. The resulting films do not exhibit uniform elemental concentrations and, therefore, do not exhibit uniform film physical properties across the surface and/or through the thickness of the film.

Deposition of such thin films with uniform elemental concentrations represents a serious challenge for vapor deposition processes that rely on conventional silicon sources, such as silane, as the silicon source precursor. Typical furnace-based deposition processes that utilize silane are generally unable to deposit continuous, smooth and homogeneous films having a thickness of 100 Å or less. Plasma-enhanced CVD processes typically have serious limitations for the deposition of homogeneous, continuous thin films with thicknesses below about 200 Å. U.S. Pat. No. 5,648,293 states that, for an amorphous silicon layer over a transistor gate insulator, when the film thickness is less than approximately 15 nanometers (150 Å), both decreased electron mobility and increased transistor threshold voltage result. Similarly, typical single wafer thermal CVD processes also suffer from an inability to deposit smooth, homogeneous thin film materials with a thickness of 150 Å or less.

Attempts to produce thin Si-containing films and incorporate them into devices have not been entirely satisfactory. For example, U.S. Pat. No. 6,194,237 discloses depositing a conductive layer of $Si_{0.7}Ge_{0.3}$ on $SiO_2$, depositing another layer of $SiO_2$ over the conductive layer, and then annealing so that the conductive layer forms quantum dots. The conductive layer is stated to have a thickness of 30 Å, but the wide variation in size and distribution for the resulting quantum dots indicates that the conductive layer was not deposited uniformly. Attempts to provide quantum dots of more uniform size and distribution have been disclosed, but typically involve high temperatures and/or more complicated deposition schemes, see, e.g., U.S. Pat. No. 6,235,618.

Japanese Patent Application Disclosure No. H3-187215 discloses the use of pure disilane (free of silane and trisilane) in a thermal CVD device to deposit a film having a thickness of 180 Å; see also Japanese Publication No. 03187215 A. U.S. Pat. No. 5,789,030 discloses a low pressure CVD ("LPCVD") method for depositing an in-situ doped silicon thin film that involves first depositing a very thin layer of silicon before introducing a dopant gas species to form the doped film. While the initial undoped layer is stated to be only several monolayers thick, the overall thickness of the layer is 500 Å to 2,000 Å, including the in situ doped portion.

The use of higher silanes such as disilane and trisilane is sometimes mentioned in the art as an alternative to the use of silane, but in most cases the only data reported concern the use of silane. Disilane ($Si_2H_6$) is known to be less stable than silane, and in deposition experiments employing disilane it was reported that disilane gives poor step coverage and that the deposition reaction is too violent to be controlled within the temperature range of 400° to 600° C., see U.S. Pat. No. 5,227,329. Trisilane is even less thermally stable than silane.

The ability to deposit very thin, smooth Si-containing films would satisfy a long-felt need and represent a significant advance in the art of semiconductor manufacturing, particularly for making future generations of microelectronic devices having ever-smaller circuit dimensions.

SUMMARY OF THE INVENTION

The inventor has discovered that trisilane can be used to deposit very thin, smooth Si-containing films. In accordance with one aspect of the invention, a preferred embodiment, a method for depositing a thin film is provided, comprising:
introducing a gas comprising trisilane to a chamber, wherein the chamber contains a substrate having a substrate surface roughness;
establishing trisilane chemical vapor deposition conditions in the chamber; and
depositing a Si-containing film onto the substrate, the Si-containing film having a thickness in the range of 10 Å to 150 Å and a film surface roughness that is greater than the substrate surface roughness by an amount of about 5 Å rms or less, over a surface area of about one square micron or greater.

In accordance with another aspect of the invention, a method for depositing a thin film is provided, comprising:
introducing trisilane to a chamber, wherein the chamber contains a substrate; and
depositing a continuous amorphous Si-containing film having a thickness of less than about 100 Å and a surface area of about one square micron or larger onto the substrate by thermal chemical vapor deposition.

In accordance with another aspect of the invention, a method of increasing semiconductor manufacturing device yield is provided, comprising:

identifying a semiconductor device manufacturing process that comprises depositing a Si-containing film onto a substrate using silane to produce a number $N_T$ of semiconductor devices, of which a number $N_A$ of the devices are acceptable and a number $N_U$ of the devices are unacceptable; wherein the Si-containing film has an average thickness of about 2000 Å or less; wherein the substrate has a surface area of about 300 cm² or greater; and wherein the process has a device yield equal to $N_A/N_T$; and replacing the silane with trisilane in the semiconductor device manufacturing process to increase the device yield.

In accordance with another aspect of the invention, an integrated circuit is provided, comprising a continuous amorphous Si-containing film having a thickness that is 15 Å or greater and that is 150 Å or less, a surface area of about one square micron or greater, and a thickness non-uniformity of about 10% or less for a mean film thickness in the range of 100 Å to 150 Å, a thickness non-uniformity of about 15% or less for a mean film thickness in the range of 50 Å to 99 Å, and a thickness non-uniformity of about 20% or less for a mean film thickness of less than 50 Å.

These and other aspects will be better understood by reference to the appended claim and the preferred embodiments, which are described in greater detail below.

BRIEF DESCRIPTION OF THE DRAWINGS

FIGS. 1-11 are non-limiting illustrations (not to scale) of various preferred embodiments.

FIG. 1 is a schematic cross-sectional view illustrating a thin Si-containing film deposited onto a semiconductor substrate in accordance with a preferred embodiment of the present invention.

FIG. 2 is a schematic cross-sectional view illustrating thickness variation in a thin Si-containing film deposited onto a semiconductor substrate.

FIG. 3 is a schematic cross-sectional view illustrating a thin Si-containing film deposited over a step formed from a semiconductor and a dielectric material.

FIG. 5 is a schematic cross-sectional view illustrating the use of a thin Si-containing film as a wetting layer prior to further deposition over a gate dielectric in a transistor gate electrode.

FIG. 8 is a schematic cross-sectional view illustrating an apparatus for depositing thin Si-containing films.

FIG. 9 is a reproduction of a cross-sectional photomicrograph showing a silicon film deposited onto a silicon dioxide substrate.

FIG. 10 is a reproduction of a cross-sectional photomicrograph showing a silicon film deposited onto a silicon dioxide substrate.

FIG. 11 is a reproduction of a cross-sectional photomicrograph showing a Si—N film deposited onto a silicon substrate.

DETAILED DESCRIPTION OF THE PREFERRED EMBODIMENTS

Figure 1:
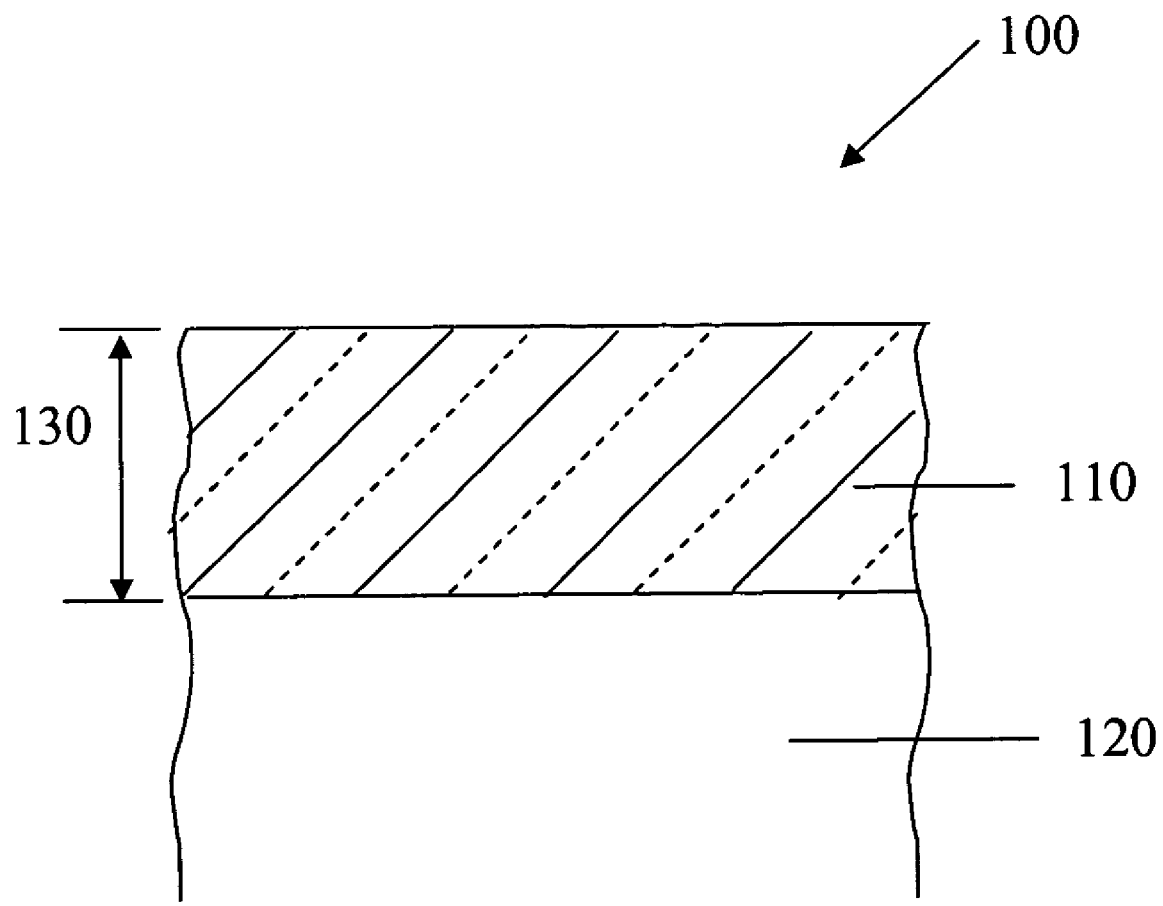

Manufacturers of microelectronic devices have long used silane ($SiH_4$) to deposit Si-containing films by CVD. Well-controlled and reproducible deposition processes are highly desirable in order to maximize device yield and production rate. However, it has been found that dynamic temperature variations, due to limitations in heating and temperature control systems, play a significant role in the non-uniformity of film deposition on substrate surfaces by CVD. It is generally desirable for the deposited film to be as uniform as possible in both thickness and elemental composition, but existing processes tend to produce films that are non-uniform to varying degrees. This is believed to result from, inter alia, temperature variations across the surface of the substrate because it has been found that the surface temperature of the substrate influences the deposition rate and the composition of the resulting film. Furthermore, temperature control systems can be dependent upon the exposed surface of the substrate, which changes as deposition progresses. Imperfect control over other process parameters, including gas flow rates and total pressure, are also believed to contribute to non-uniformities in film physical properties. Temperature variations of SiC-coated graphite components (e.g., pre-heat ring and susceptor) in single wafer, horizontal gas flow reactors can also contribute to film non-uniformities.

Because of these process variations, the rate of deposition at any particular instant varies as a function of position on the film, resulting in thickness variations across the surface of the film. Similarly, the composition of the film that is being deposited at any particular instant in time varies from place to place across the surface of the substrate for multi-component films. Without being limited by theory, such variation may be a direct consequence of the difference in dissociative absorption activation energy that exists between the precursors (including dopant precursors) used to introduce each of the elemental components of the multi-component film. This means that the averaging-out/tuning approaches discussed below do not necessarily solve the problem of compositional non-uniformity.

In many cases, manufacturing involves depositing Si-containing films during the process of making dozens or even hundreds of devices simultaneously on a wafer that is 200 millimeters (mm) in diameter. The industry is currently transitioning to 300 mm wafers, and may use even larger wafers in the future. Significant variations in the thickness and/or composition of the Si-containing films during the manufacturing process can lead to lower manufacturing yields when the affected devices do not meet the required performance specifications or standards. Also, variations across the film within a particular device can reduce device performance and/or reliability.

Thickness non-uniformity can be mitigated to a certain extent by depositing relatively thick films. This approach relies on the fact that non-uniformities tend to average out over the deposition time of any particular layer. Reactor process variables such as temperature and placement of heating lamps, gas flow rate, gas pressure, gas composition, etc. can be tuned to average out the total film thickness, particularly in single-wafer systems with rotating wafer support.

Tuning involves depositing a large number of films, each under a different pre-selected set of deposition conditions. The thickness variations within each film are then measured and the results analyzed to identify conditions that reduce or eliminate the thickness variations. The inventor has realized, however, that tuning does not necessarily achieve uniform temperature distributions throughout the process; rather, the result of the tuning process is to time-average the thickness variations produced by the temperature variations for a specific reaction temperature set point.

Accordingly, tuning does not necessarily produce uniform temperatures across the substrate throughout the deposition process. This, in turn, raises the issue of compositional variation because compositional homogeneity is desired in three dimensions, both across the film surface and through the film thickness. This is because many films contain dopants and the level of these dopants influences the electronic properties of the film. Non-uniform temperatures can result in non-uniform incorporation of dopants into the film. Similarly, other non-uniformities can result.

The problem of deposition non-uniformity is particularly acute when depositing very thin Si-containing films. The ability to produce thin films is becoming more important as circuit dimensions shrink and the resulting devices become more compact. However, the averaging-out/tuning approaches described above are becoming increasingly inadequate because the deposition process time for a thin film is generally shorter than for a thick film, allowing less time for film thickness to average-out. In addition, highly compact devices are more sensitive to compositional non-uniformities, a problem that is not adequately addressed by averaging-out/reactor tuning.

Film uniformity in thin films is also affected by nucleation phenomena. Nucleation is not completely understood, but silane deposition has been observed to occur by a process in which a number of separate silicon islands initially form on the surface of the substrate. As the deposition proceeds, these islands tend to grow until they contact one another, eventually forming a continuous silicon film. At this point the silicon film typically has a rough surface with peaks that correspond to the initial nucleation sites and valleys that correspond to the contact areas. The surface roughness is particularly evident when depositing layers, and particularly doped layers, over dielectric surfaces such as silicon oxide or silicon nitride. As deposition proceeds further and the film thickens, thickness uniformity increases by an averaging-out process similar to that described above.

Thin, continuous Si-containing films are generally very difficult to prepare by existing silane deposition processes because the film may reach the desired thickness in the regions near the peaks of the islands before the islands have grown together to form a continuous film. These problems are exacerbated for thinner films and by surface mobility of atoms in amorphous films. Continuity problems are typically observed when using a silane deposition process to make films having a thickness of about 200 Å or less, and even more so for films having a thickness of less than about 100 Å. These problems are also exacerbated as the surface area of the film increases. Serious difficulties are often encountered for very thin films having a surface area of about one square micron or greater, and even more so for very thin films having a surface area of about 5 square microns or greater. The nature of the substrate can also complicate silane deposition to the extent that the surface influences nucleation and growth. Thus, for example, the deposition of very thin continuous amorphous Si-containing films over patterned dielectric substrates using silane is particularly challenging.

Film deposition methods that utilize a Si-containing precursor, preferably trisilane ($H_3SiSiH_2SiH_3$), have now been discovered that are much less sensitive to temperature variations across the surface of the substrate. In preferred embodiments, these methods are also much less sensitive to nucleation phenomena. Practice of the deposition methods described herein provides numerous advantages. For example, the methods described herein enable the production of novel Si-containing films that are uniformly thin, as well as doped Si-containing films in which the dopant is uniformly distributed throughout the film, preferably in both the across-film and through-film directions. The methods described herein also enable the production of very thin, continuous films. These advantages, in turn, enable devices to be produced in higher yields, and also enable the production of new devices having smaller circuit dimensions and/or higher reliability. These and other advantages are discussed below.

The Si-containing films described herein can be made by a variety of methods. Preferably, deposition is conducted under trisilane deposition conditions that are in or near the mass transport limited regime for trisilane. In the mass transport limited regime, deposition rates are essentially independent of temperature. This means that small temperature variations across the surface of the substrate have little or no effect on deposition rate. It has been found that this greatly minimizes thickness and compositional variations and enables the production of the preferred Si-containing films described herein.

Trisilane deposition conditions are thus preferably created by supplying sufficient energy to enable the trisilane to deposit at a rate that is controlled primarily by the rate at which it is delivered to the substrate surface, more preferably by heating the substrate as described below. A preferred deposition method involves establishing trisilane deposition conditions in a suitable chamber in the presence of trisilane and depositing a Si-containing film onto a substrate contained within the chamber.

Deposition of trisilane may be suitably conducted according to the various CVD methods known to those skilled in the art, but the greatest benefits are obtained when deposition is conducted according to the CVD methods taught herein. The disclosed methods may be suitably practiced by employing CVD, including plasma-enhanced chemical vapor deposition (PECVD) or thermal CVD, utilizing gaseous trisilane to deposit a Si-containing film onto a substrate contained within a CVD chamber. Thermal CVD (i.e., without plasma assistance) is preferred.

In a preferred embodiment, trisilane is introduced to the chamber as a component of a feed gas. A suitable manifold may be used to supply feed gas(es) to the CVD chamber. Preferably, the gas flow in the CVD chamber is horizontal, most preferably the chamber is a single-wafer, horizontal gas flow reactor, preferably radiatively heated. Suitable reactors of this type are commercially available, and preferred models include the Epsilon™ series of single wafer reactors commercially available from ASM America, Inc. of Phoenix, Ariz. While the methods described herein can also be employed in alternative reactors, such as a showerhead arrangement, benefits in increased uniformity and deposition rates have been found particularly effective in the horizontal, single-pass laminar gas flow arrangement of the Epsilon™ chambers, employing a rotating substrate. CVD may be conducted by introducing a plasma to the chamber, but deposition in the absence of a plasma within the chamber is preferred, and thermal CVD is most preferred.

Trisilane is preferably introduced to the CVD chamber in the form of a feed gas or as a component of a feed gas. The total pressure in the CVD chamber is preferably in the range of about 0.001 torr to about 780 torr, more preferably in the range of about 0.1 torr to about 760 torr, most preferably in the range of about 1 torr to about 700 torr. The partial pressure of trisilane is preferably in the range of about 0.0001% to about 100% of the total pressure, more preferably about 0.001% to about 50% of the total pressure. Surprisingly, deposition in the pressure range of 1 Torr to 100 Torr has been found to result in excellent uniformity. Such results are surprising due to the generally held belief that such conditions using conventional precursors result in gas phase reactions, which would reduce film conformality.

The feed gas can also include gases other than trisilane, such as inert carrier gases. Hydrogen or nitrogen are preferred carrier gases for the methods described herein. Preferably, trisilane is introduced to the chamber by way of a bubbler used with a carrier gas to entrain trisilane vapor, more preferably a temperature controlled bubbler.

The feed gas may also contain other materials known by those skilled in the art to be useful for doping or alloying Si-containing films, as desired. Preferably the gas is further comprised of an element selected from the group consisting of germanium, carbon, boron, indium, arsenic, phosphorous, antimony, nitrogen and oxygen. In some arrangements, the gas is further comprised of one or more compounds selected from the group consisting of the following non-limiting examples: silane, disilane, tetrasilane, germane, digermane, trigermane, $NF_3$, monosilylmethane, disilylmethane, trisilylmethane, tetrasilylmethane, hydrocarbons (e.g., methane, ethane, propane, etc.), carbon monoxide, carbon dioxide, HCN (hydrogen cyanide), ammonia, atomic nitrogen, hydrazine, $N_2O$, $NO_2$, and a dopant precursor.

Incorporation of dopants into Si-containing films by CVD using trisilane is preferably accomplished by in situ doping using gas phase dopant precursors. Precursors for electrical dopants include diborane, deuterated diborane, phosphine, arsenic vapor, and arsine. Silylphosphines $[(H_3Si)_{3-x}PR_x]$ and silylarsines $[(H_3Si)_{3-x}AsR_x]$ where x=0–2 and $R_x$=H and/or D are preferred precursors for phosphorous and arsenic as dopants. $SbH_3$ and trimethylindium are preferred sources of antimony and indium, respectively. Such dopant precursors are useful for the preparation of preferred semiconductor films as described below, preferably boron-, phosphorous-, antimony-, indium-, and arsenic-doped silicon, Si—C, Si—Ge and Si—Ge—C films and alloys.

The amount of dopant precursor in the feed gas may be adjusted to provide the desired level of dopant in the Si-containing film. Typical concentrations in the feed gas can be in the range of about 1 part per million (ppm) to about 1% by weight based on total feed gas weight, although higher or lower amounts are sometimes preferred in order to achieve the desired property in the resulting film. In the preferred Epsilon™ series of single wafer reactors, dilute mixtures of dopant precursor in a carrier gas can be delivered to the reactor via a mass flow controller with set points ranging from about 10 to about 200 standard cubic centimeters per minute (sccm), depending on desired dopant concentration and dopant gas concentration. The dilute mixture is preferably further diluted by mixing with trisilane and any trisilane carrier gas. Since typical total flow rates for deposition in the preferred Epsilon™ series reactors often range from about 20 standard liters per minute (slm) to about 180 slm, the concentration of the dopant precursor used in such a method is usually very small.

The relative partial pressures of trisilane and other components of the gas are preferably held relatively constant over the course of depositing the Si-containing film. Film thickness may be varied according to the intended application as known in the art, by varying the deposition time and/or gas flow rates for a given set of deposition parameters (e.g., total pressure and temperature). To achieve substantially uniform incorporation of a component into the resulting film, the component (or its precursor) and trisilane are preferably mixed together to form a homogenous gaseous mixture prior to deposition.

For thermal CVD using trisilane, deposition is preferably conducted at a substrate temperature of about 400° C. or greater, more preferably about 450° C. or greater, even more preferably about 500° C. or greater. Preferably, deposition of amorphous films takes place at a temperature of about 750° C. or less, more preferably about 650° C. or less, most preferably about 600° C. or less. Such temperatures are preferably achieved by heating the substrate to the indicated temperature. As temperatures are increased beyond about 600° C., surface roughness tends to increase due to the transition to microcrystalline and polycrystalline structures and deposition rates tend to be higher. Epitaxial films may be obtained by deposition at sufficiently high temperatures onto properly prepared substrates. Those skilled in the art can adjust these temperature ranges to take into account the realities of actual manufacturing, e.g., preservation of thermal budget, tolerance for surface roughness in a particular application, tolerance for compositional variations, etc. For example, deposition temperatures in the range of about 450° C. to about 525° C. are preferred for the deposition of extremely thin (e.g., about 10 Å to about 50 Å) amorphous Si-containing films onto an oxide substrate using trisilane. Preferred deposition temperatures thus depend on the desired application, but are typically in the range of about 400° C. to about 750° C., preferably about 425° C. to about 700° C., more preferably about 450° C. to about 650° C.

Deposition of the films described herein is preferably conducted at a rate of about 5 Å per minute or higher, more preferably about 10 Å per minute or higher, most preferably about 20 Å per minute or higher. Better thickness uniformity is generally achieved at relatively lower deposition rates, particularly for relatively thin films.

Preferred trisilane deposition methods enable the production of thin, continuous, Si-containing films over various substrates. A schematic cross-sectional view (not to scale) illustrating such a preferred structure 100 is shown in FIG. 1, showing a Si-containing film 110 deposited directly on a substrate 120. A preferred substrate comprises a non-single crystal material, more preferably comprises a dielectric material. Examples of preferred dielectric materials include various silicon oxides and metal oxides, metal silicates, silicon oxynitrides and silicon nitrides.

The Si-containing film is preferably amorphous, polycrystalline, or single crystalline. The Si-containing film can comprise one or more other elements in addition to silicon such as germanium, nitrogen, carbon, boron, indium arsenic, phosphorous, and antimony. Preferred dopants for Si-containing films are arsenic, boron and phosphorous. The dopant concentration in Si-containing films, when doped, is preferably in the range of from about $1 \times 10^{14}$ to about $1 \times 10^{22}$ atoms/cm$^3$.

Preferably, the one or more other elements are distributed more uniformly throughout the Si-containing film than when silane is used as the silicon source in an optimized process.

Compositional uniformity can be determined by using electrical measurements (e.g., 4-point probe), SIMS (Secondary Ion Mass Spectrometry), RBS (Rutherford Backscattering Spectroscopy), Spectroscopic Ellipsometry and/or high resolution X-ray diffractometry (HR-XRD).

When comparing one Si-containing film to another, or one deposition process to another, compositional uniformity is measured using SIMS across a circular wafer substrate onto which the Si-containing has been deposited. SIMS measurements are made at three locations: one at the center of the wafer, one at a point midway between the center and the edge ("r/2"), and one at a point 3 millimeters from the edge ("3 mm edge exclusion"). For each non-silicon element in question, the amount of that element at each location is then determined from the SIMS data, and the resulting value expressed in atomic % based on total. The three values are then averaged, and the standard deviation determined.

For a given Si-containing film or deposition process, compositional non-uniformity is the standard deviation divided by the sum of the maximum and minimum measured values, and the result expressed as a percentage. For example, if the three values are 3 atomic %, 5 atomic %, and 10 atomic %, the compositional non-uniformity is 28% because the sum of the minimum and maximum values is 13 and the standard deviation is 3.6 (3.6/13=28%). Preferred values of compositional non-uniformity vary, depending on the amount of the element in the Si-containing film. If the amount of element is 1 atomic % or greater, the compositional non-uniformity for the Si-containing film is preferably about 25% or less, more preferably about 20% or less, even more preferably about 15% or less, most preferably about 10% or less. Ge content in SiGe films, for example, will typically represent greater than about 1 atomic % of such films, such that the above preferences apply to SiGe films. If the amount of element is in the range of 0.001 atomic percent up to 1 atomic %, the compositional non-uniformity for the Si-containing film is preferably about 100% or less, more preferably about 75% or less, even more preferably about 50% or less, most preferably about 25% or less. If the amount of element is below 0.001 atomic percent, the compositional non-uniformity for the Si-containing film is preferably in the range of about 400% or less, more preferably about 300% or less, even more preferably about 200% or less, most preferably about 100% or less. Ge content in graded SiGe films, for example, may vary over a broad range, and thus more than one of the above ranges may apply depending on the profile.

The deposition methods described herein can be used to deposit thicker films, but particularly advantageous aspects of these methods are realized when the thickness of the Si-containing film is about 500 Å or less. The methods described herein tend to become progressively more useful, as compared to conventional processes, as film thickness decreases and thus are preferably used to deposit preferred Si-containing films having a thickness of about 150 Å or less, more preferably about 125 Å or less, most preferably less than about 100 Å. Preferred Si-containing films have a thickness of about 10 Å or more, more preferably about 20 Å or more, most preferably about 25 Å or more, in order to better ensure continuity of the deposited film. The methods described herein thus enable the deposition of preferred Si-containing films having thicknesses that are in the range of about 10 Å to about 150 Å, more preferably about 20 Å to about 125 Å, most preferably about 25 Å to less than about 100 Å.

Figure 2:
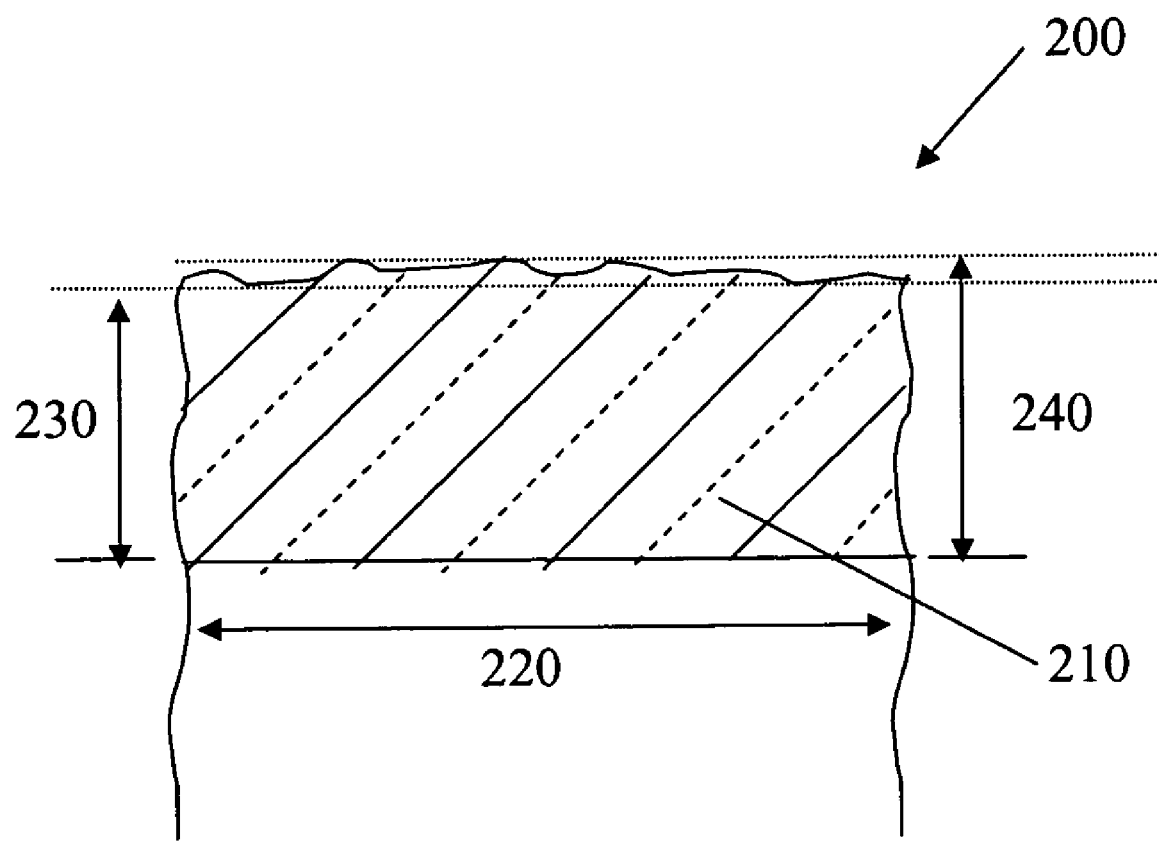

Suitable methods for measuring film thickness include multiple-point ellipsometric methods. Instruments for measuring film thickness are well known and commercially available. Preferred instruments include the NanoSpec® series of instruments from Nanometrics, Inc., Sunnyvale, Calif. The thickness of a Si-containing film can also be determined by cross-sectioning the substrate and measuring the thickness by an appropriate microscopy technique, most preferably by electron microscopy. For example, FIG. 1 illustrates the cross-sectional measurement of thickness 130. The span over which a thickness is measured can be any span in the range of from about 10 times the thickness of the film to the entire span of the Si-containing film. If the thickness varies over the span, then the thickness is considered to be the average thickness, i.e., the numerical average of the thickest and thinnest dimensions of the film over a given span. For example, for the structure 200 illustrated in FIG. 2, the Si-containing film 210 has an average thickness over the span 220 that is equal to one-half of the sum of thickness 230 and thickness 240.

As used herein, rms (more properly, the square root of the mean squared error) is a way of expressing the amount of variability exhibited by the members of a given population. For example, in a group of objects having an average weight of y grams, each member of the group has a weight y' that differs from the average by some amount, expressed as (y'−y). To calculate rms, these differences are squared (to ensure that they are positive numbers), summed together, and averaged to yield a mean squared error. The square root of the mean squared error is the rms variability.

Preferred Si-containing films have a thickness that is highly uniform across the surface of the film. In general, measurements of uniformity described herein can be on a film obtained by blanket deposition over a bare or oxide-covered 200 mm or 300 mm wafer, and no measurements are taken within a 3 mm exclusion zone at the wafer periphery. Film thickness uniformity is determined by making multiple-point thickness measurements along a randomly selected diameter, determining the mean thickness by averaging the various thickness measurements, and determining the rms variability. A preferred instrument for measuring film thickness utilizes a Nanospec® 8300 XSE instrument (commercially available from Nanometrics, Inc., Sunnyvale, Calif.), and a preferred measurement method involves using such an instrument to measure the film thickness at 49 points along a randomly selected wafer diameter. In practice, thickness variability is typically obtained directly from the instrument following such a measurement, and thus need not be calculated manually. To enable comparisons, the results can be expressed as percent non-uniformity, calculated by dividing the rms thickness variability by the mean thickness and multiplying by 100 to express the result as a percentage. When measuring thickness uniformity of a film having a surface that is not accessible to such a measurement, e.g., a film onto which one or more additional layers have been applied, or a film contained within an integrated circuit, the film is cross sectioned and examined by electron microscopy. The film thickness is measured at the thinnest part of the cross sectioned film and at the thickest part, and the range in thickness measurements (e.g., ±6 Å) between these two points is then divided by the sum of the two measurements. This non-uniformity is expressed as a percentage herein.

For all films, percent thickness non-uniformity is preferably about 20% or less. Depending on the mean thickness of the film, additional values for percent thickness non-uniformity may be preferred as shown in Table 1 below. Each value for % thickness non-uniformity shown in Table 1 is to be understood as if preceded by the word "about."

TABLE 1

| Mean Film Thickness, Å | Preferred Range of % Thickness Non-Uniformity | More Preferred Range of % Thickness Non-Uniformity | Most Preferred Range of % Thickness Non-Uniformity |
|---|---|---|---|
| >150 Å | <10 | <8 | <4 |
| 100-150 | <10 | <8 | <6 |
| 50-99 | <15 | <10 | <8 |
| <50 | <20 | <15 | <10 |

Figure 3:
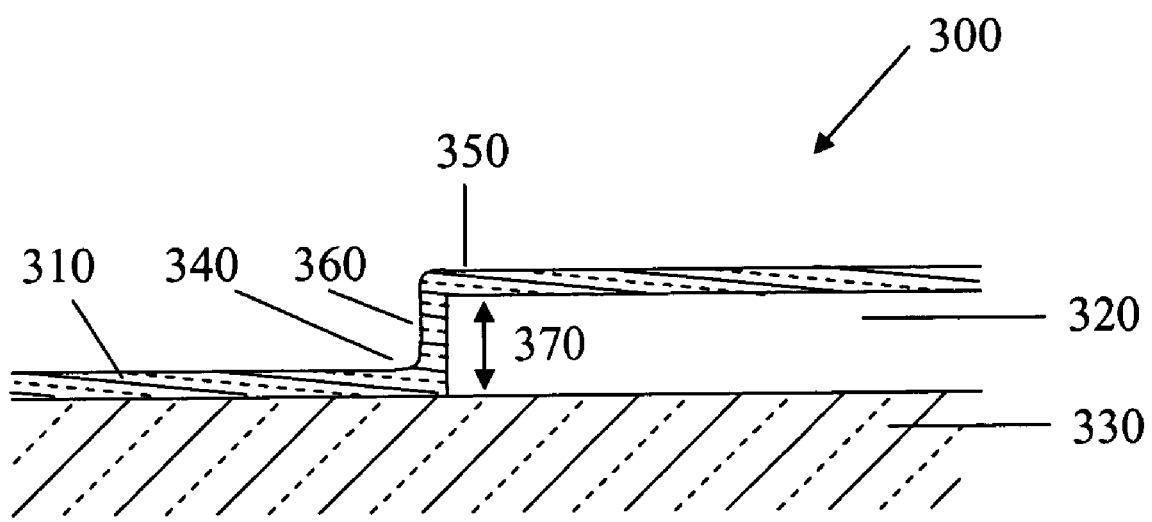
Figure 4A:
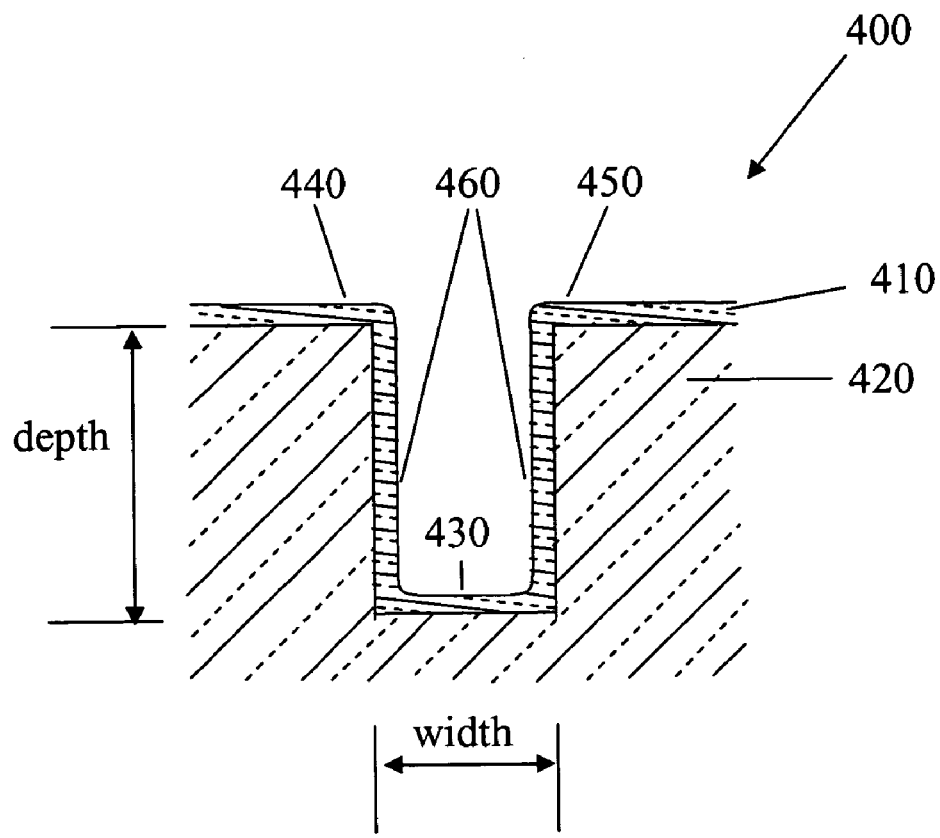
FIG. 4A is a schematic cross-sectional view illustrating a thin Si-containing film deposited over a trench formed in a semiconductor.

The Si-containing film preferably provides conformal coating over varied topography. A conformal coating is a layer that follows the curvature, if any, of the layer that it overlies. Preferred Si-containing films exhibit good step coverage. "Step coverage" refers to the thickness uniformity of a conformal Si-containing film that overlies a stepped surface. A stepped surface is a surface that has two or more parallel components that are not disposed in the same horizontal plane. For example, FIG. 3 illustrates a structure 300 in which a Si-containing film 310 exhibits good step coverage over the step created by the presence of silicon oxide layer 320 on silicon substrate 330. Step coverage is preferably determined by measuring the average thickness of the Si-containing film at the bottom of the step 340, dividing it by the average thickness at the top of the step 350, and multiplying by 100 to express the result in percentage terms. Likewise, FIG. 4A illustrates a trench structure 400 in which a Si-containing film 410 exhibits good step coverage over the trench in semiconductor substrate 420. Step coverage is preferably determined similarly by measuring the average thickness of the Si-containing film at the bottom of the trench 430, dividing it by the average thickness at the top of the trench 440 and 450, and multiplying by 100 to express the result in percentage terms. Preferred Si-containing films have good step coverage even at relatively high aspect ratios. "Aspect ratio" refers to the ratio of the vertical height of the step to the horizontal width of the structure. For example, the aspect ratio of the trench illustrated in FIG. 4 is equal to trench width divided by trench depth.

At an aspect ratio in the range of about 4.5 to about 6, preferred Si-containing films have a step coverage of about 70% or greater, preferably 80% or greater. At an aspect ratio in the range of about 1 to about 4, preferred Si-containing films have a step coverage of about 80% or greater, preferably 90% or greater. Step coverage is preferably calculated as stated above, but can also be calculated by taking into account sidewall thickness 360 or 460. For example, alternate definitions of step coverage involve the ratio of the sidewall thickness to the average thickness at the top and/or bottom of the step, e.g., thickness at 460 divided by thickness at 430, or thickness at 460 divided by the average of thickness at 440 and 450. However, unless otherwise stated, step coverage herein is determined as stated above by measuring the average thickness of the horizontal portions of the Si-containing film at the bottom of the step, dividing it by the average thickness of the horizontal portions at the top of the step, and multiplying by 100 to express the result in percentage terms.

Advantageously, surface smoothness and thickness of the Si-containing film as defined herein is maintained over a surface area of about one square micron ($\mu m^2$) or greater, more preferably about 5 $\mu m^2$ or greater, even more preferably about 10 $\mu m^2$ or greater. The Si-containing film can cover all or part of a large substrate, e.g., a wafer, and thus can have a surface area of about 300 $cm^2$ or greater, preferably about 700 $cm^2$ or greater. A surface can be characterized as being in contact with a particular material, and thus a surface area in contact with a particular layer can be specified. For example, a Si-containing film can overlie a dielectric material and a semiconductor material. Preferably, the Si-containing film has a surface area in contact with the dielectric material of about 5 $\mu m^2$ or greater, more preferably about 10 $\mu m^2$ or greater. More preferably, the Si-containing film is a conformal coating.

Since good step coverage is usually achieved, in many cases the surface roughness of the Si-containing film is substantially the same as the roughness of the surface that it overlies. Surface roughness is preferably rms surface roughness as measured by atomic force microscopy (AFM) on a 1 micron×1 micron portion of surface in question. The roughness of the underlying substrate surface can range from about 1 Å rms (atomically flat surface) up to about 25 Å rms or even higher. Preferably, the underlying substrate surface has a roughness of 10 Å rms or less, more preferably 5 Å rms or less, so that the overlying Si-containing film has a comparable roughness. For an underlying substrate surface having a given degree of roughness, the Si-containing film deposited thereon preferably has a surface roughness that is greater than the substrate surface roughness by an amount of about 5 Å or less, more preferably about 3 Å or less, even more preferably about 2 Å or less. For example, if the substrate surface roughness is about 7 Å rms, then the measured surface roughness of the Si-containing film deposited thereon is preferably about 12 Å rms (7 Å+5 Å) or less. Preferably, the underlying surface has a roughness of about 2 Å rms or less and the overlying Si-containing film has a measured surface roughness of about 5 Å rms or less, more preferably about 3 Å rms or less, most preferably about 2 Å rms or less. Note that the surface roughness measurements described herein are taken as-deposited, prior to any etch or polishing processes, or any subsequent thermal processing Preferred Si-containing films are thin and continuous over an area of about 1 $\mu m^2$ or greater, more preferably about 5 $\mu m^2$ or greater, even more preferably about 10 $\mu m^2$ or greater. As film thicknesses decreases, film continuity over such areas tends to become progressively more difficult to achieve. The methods described herein are useful for preparing thicker continuous Si-containing films, but are particularly useful for depositing continuous films having a thickness of about 125 Å or less, even more so for films having a thickness of less than about 100 Å, and especially useful for films having a thickness of about 80 Å or less.

Various materials can be deposited in the usual fashion over the Si-containing materials described herein, including metals, dielectric materials, semiconductors, and doped semiconductors. Si-containing materials may also be subjected to other semiconductor manufacturing processes such as annealing, etching, ion implantation, polishing, etc.

Figure 5:
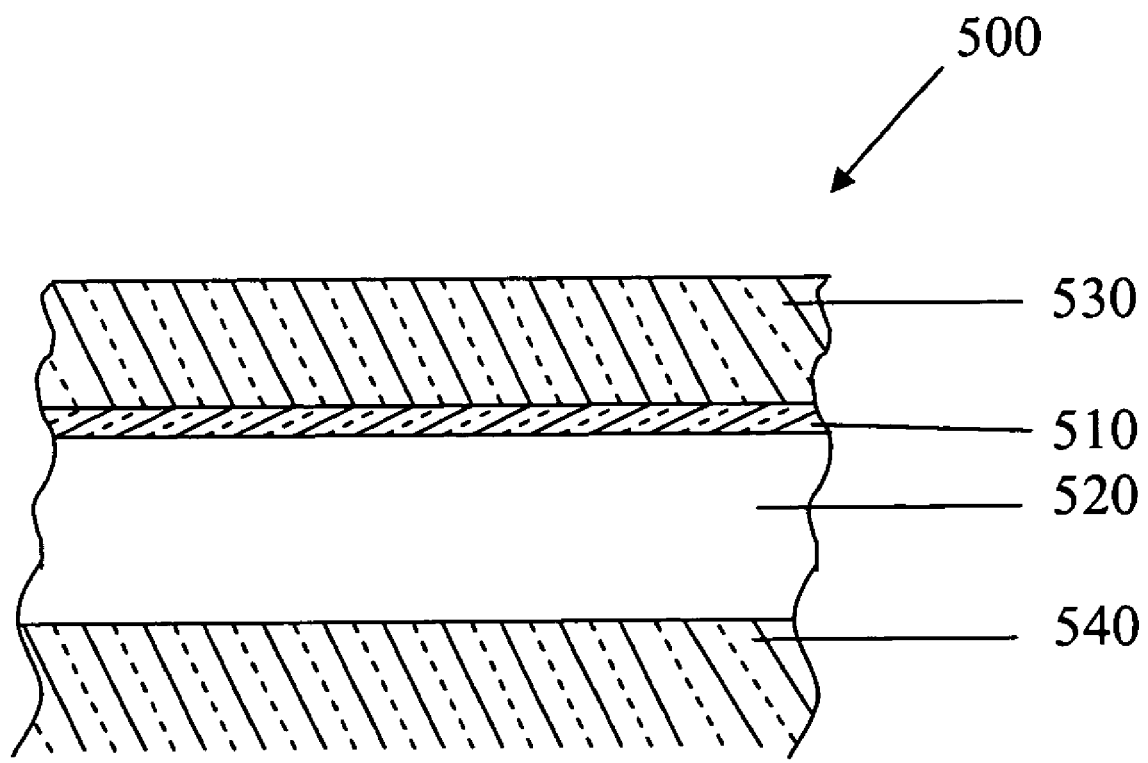

A preferred embodiment provides a wetting layer useful for making multilayer structures comprised of different materials. For example, the method of making a transistor gate electrode involves depositing a semiconductor layer, such as doped silicon, doped silicon germanium, doped silicon carbon or doped silicon germanium carbon onto a dielectric material such as silicon dioxide. The deposition method can be improved by first depositing a wetting layer onto the dielectric material, then depositing the semiconductor layer onto the wetting layer. FIG. 5 illustrates a portion of a gate electrode stack 500 (prior to patterning) having such a wetting layer 510 sandwiched between dielectric layer 520 and gate electrode 530. The stack 500 is formed over a semiconductor substrate 540.

Figure 6A:
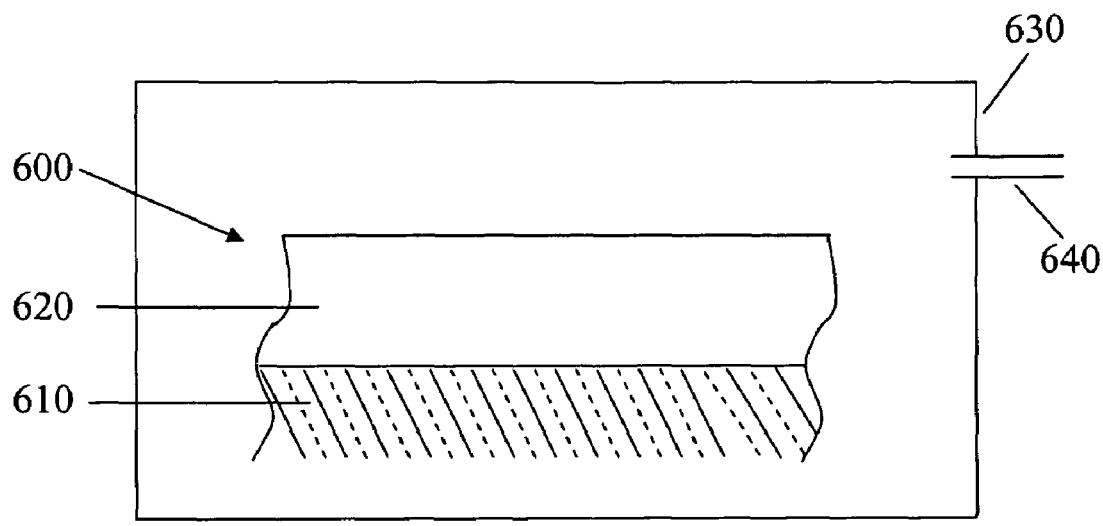
FIGS. 6A to 6C are schematic cross-sectional views illustrating a sequence for depositing a thin Si-containing film as a wetting layer in a transistor gate electrode deposition process.
Figure 6B:
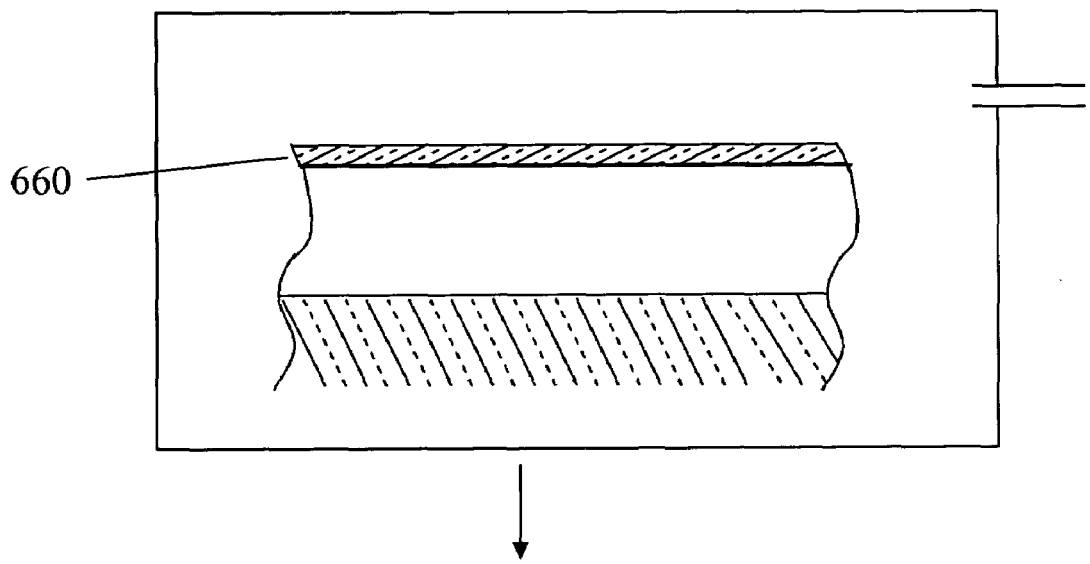
Figure 6C:
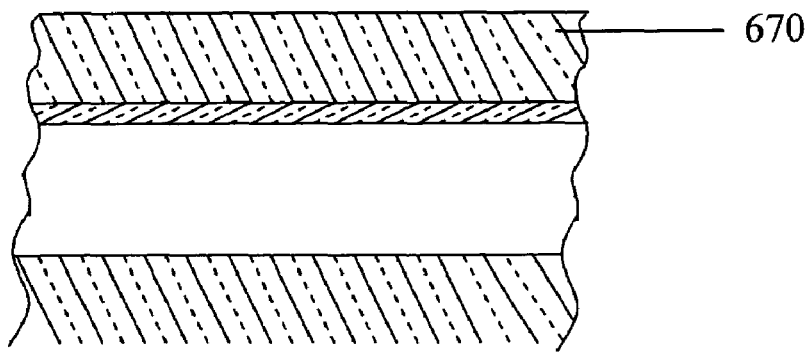

A preferred method for making a transistor gate electrode is illustrated schematically by the sequence in FIGS. 6A to 6C (not to scale, shown prior to patterning). A workpiece 600 comprising a semiconductor substrate 610, preferably doped silicon, and an overlying thin gate dielectric layer 620, preferably silicon dioxide, is placed into a chamber 630. Trisilane deposition conditions are established, preferably by heating the substrate 600 to a temperature in the range of about 450° C. to about 550° C., and a gas comprising trisilane is introduced to the chamber 630 via a feed line 640. An amorphous silicon film having a thickness in the range of about 25 Å to about 100 Å and a surface roughness of about 5 Å rms or less is deposited onto the dielectric layer 620 to form a wetting layer 660. A gate electrode is then formed by depositing a semiconductor layer, preferably doped silicon, more preferably doped Si—Ge, doped Si—C, or doped Si—Ge—C onto the wetting layer 660. A thin, continuous amorphous silicon wetting layer improves the uniformity of the overlying semiconductor layer and presents a minimal barrier to the diffusion of elements such as germanium to the interface with the gate dielectric 620.

Another preferred embodiment provides a method of forming quantum dots. A quantum dot is a particle of material in which one or more electrons are confined to a region having a maximum dimension in any direction that is less than or equal to the electron wavelength, so that the electrons are essentially confined to zero dimensions. The electrons in a quantum dot occupy well-defined, discrete quantum states that are a function of the size of the confinement region.

Potential practical applications for quantum dots include quantum optical devices (e.g., lasers and detectors) and quantum electronic devices (e.g., diodes and transistors). However, such applications have been slow to develop because of the difficulty of fabricating such structures, see E. Corcoran and G. Zorpette, "Diminishing Dimensions," Scientific American, October 1997. Using the trisilane deposition methods described herein, quantum dots having more uniform size and/or distribution can be made, as compared to methods utilizing silane.

Figure 7A:
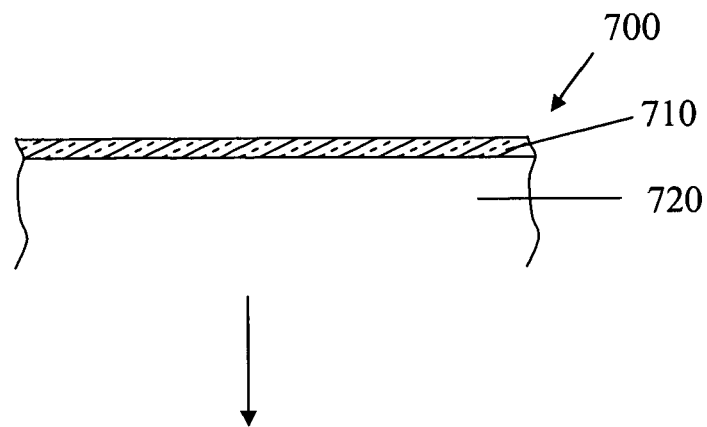
FIGS. 7A to 7C are schematic cross-sectional views illustrating a sequence for depositing a thin Si-containing film and annealing to form quantum dots.
Figure 7B:
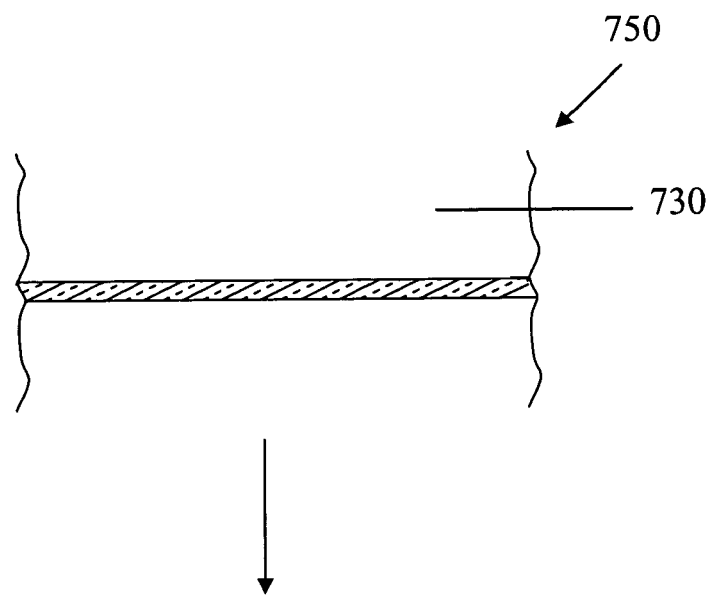
Figure 7C:
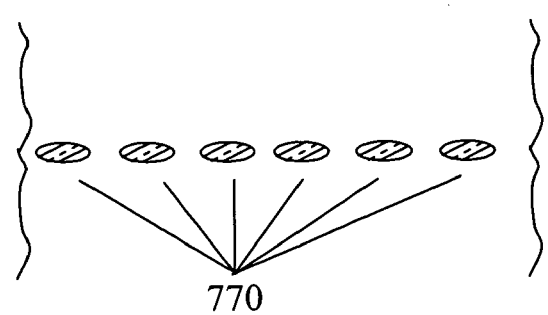

A preferred method for making quantum dots is illustrated schematically by the sequence shown in FIGS. 7A to 7C. The method is based on the observation that discrete Si-containing particles can be formed on a surface by annealing an amorphous Si-containing film previously deposited thereon. This invention is not bound by theory, but it is believed that annealing causes the thin film to break apart into regions that further agglomerate into separated crystalline grains. Annealing a non-uniform film results in quantum dots that are similarly non-uniform, whereas annealing the uniform films described herein results in quantum dots having greater size and/or spatial uniformity.

A preferred method for making quantum dots is now described with reference to FIGS. 7A to 7C, although it will be understood that the method is not limited to this preferred embodiment. Structure 700 is formed by depositing a Si-containing film 710 onto a dielectric structure 720. In this method, the dielectric layer 720 preferably comprises silicon dioxide over a semiconductor substrate. More preferably, dielectric 720 is a tunnel oxide having a thickness of about 100 Å or less, preferably about 50 Å or less. Dielectric 720 is placed into a chamber (not shown) and heated to a temperature in the range of about 450° C. to about 550° C. while trisilane and, optionally, a dopant precursor are introduced to the chamber, to deposit onto the dielectric 720 a thin, smooth, continuous Si-containing film 710 having a thickness in the range of about 25 Å to about 100 Å and a surface roughness of about 5 Å rms or less. Film 710 can then be annealed to form a plurality of quantum dots (not shown). Preferably, a second dielectric layer 730, preferably also comprising silicon dioxide, is first deposited onto film 710. The resulting structure 750 is then annealed, preferably at a temperature in the range of about 600° C. to about 800° C., to form a plurality of quantum dots 770. Quantum dots can also be made by the method described in U.S. Pat. No. 6,235,618, except that the silicon thin film is not formed using a silicon vapor deposition technique as described therein, but is instead deposited using trisilane as described herein.

Because the film 710 is thin and uniform, the resultant quantum dots 770 have a more uniform size and/or spatial distribution than those made by a comparable silane-based optimized method. Preferred quantum dots have a grain size of about 200 Å or less, preferably about 100 Å or less, depending on the desired application. Size uniformity is preferably determined by measuring average quantum dot size and rms size variability. Preferably, rms size variability is about 15% or less, preferably 10% or less, based on the average quantum dot size. For example, for a structure having an average quantum dot size of 50 Å, the size variability is preferably 7.5 Å rms (15% of 50 Å) or less. Spatial uniformity is preferably determined by measuring the average number of quantum dots per given area and the rms spatial variability. Preferably, the rms spatial variability is about 5% or less. For example, for a structure having an average of 50 quantum dots per 0.1 $\mu m^2$, the spatial variability is preferably 2.5 per 0.1 $\mu m^2$ rms (5% of 50) or less. Quantum dots as described herein are useful in a number of applications, e.g., single electron transistors, quantum dot infrared photodetectors, and sparse carrier devices. See U.S. Pat. Nos. 6,194,237; 6,211,013; 6,235,618; 6,239,449; and 6,265,329, all of which are hereby incorporated by reference in their entireties, and particularly for the express purpose of describing quantum structures, fabrication methods, and applications.

Another preferred embodiment provides a method for making a diffusion source or diffusion layer. A diffusion source is a layer that acts as a source of one or more dopant elements. Such diffusion layers are typically deposited in close proximity to a region where the dopant is desired, then heated to drive the dopant from the diffusion layer to the desired destination. However, there are limitations on the use of such diffusion sources. For example, the deposition and drive steps are time-consuming, and the heating involved in these steps may exceed thermal budgets. Other doping methods such as ion implantation can be used, but shallow implantation is difficult to achieve by ion implantation.

Thus, there is a problem in making shallow doped regions such as shallow source-drain junctions. To minimize the impact on thermal budgets, attempts have been made to deposit thin diffusion sources in order to reduce the length of the diffusion pathway. However, such attempts using silane as the silicon source have been unsatisfactory because the deposition temperature for silane is high and because thickness non-uniformities in the diffusion layer resulted in corresponding dopant non-uniformities after the drive step.

It has now been discovered that thin, uniform Si-containing diffusion sources can be made using trisilane as the silicon source. These diffusion sources are preferably made by introducing trisilane and a dopant precursor to a chamber and depositing a highly doped Si-containing film by thermal CVD onto a substrate, in close proximity to the ultimate destination for the dopant. The amount of dopant precursor introduced to the chamber can vary over a broad range, depending on the ultimate application, but is preferably effective to provide a dopant concentration in the resulting diffusion source in the range of from about $1\times10^{16}$ to about $1\times10^{22}$ atoms/cm$^3$. The ratio of dopant precursor to trisilane introduced to the chamber can range from about 0.00001% to 150%, preferably about 0.001% to about 75%, by weight based on total weight of trisilane and dopant precursor.

Diffusion layer deposition temperatures can be in the range of from about 400° C. to about 650° C., but are preferably in the range of about 450° C. to about 600° C. Lower deposition temperatures tend to have a smaller impact on thermal budgets and provide smoother, more continuous films, but higher temperatures tend to provide faster deposition. The thickness of the diffusion source is preferably in the range of about 25 Å to about 150 Å, more preferably about 50 Å to about 100 Å. The diffusion source is preferably a continuous Si-containing film having a substantially uniform thickness, more preferably having a thickness non-uniformity of about 10% or less, and a substantially uniform distribution of dopant(s).

Hemispherical grain (HSG) silicon films are known. See, e.g., U.S. Pat. Nos. 5,885,869; 5,837,580; and 5,656,531. HSG silicon films can be made by annealing an amorphous Si-containing film to roughen the surface to varying degrees, depending on film thickness, annealing time and annealing temperature. It is believed that the silicon atoms migrate at the annealing temperature to form crystalline regions that are thermodynamically favored at the annealing temperature. The presence of the crystalline grains produces surface roughness that appear as generally hemispherical mounds on the surface. The size of the grains is generally greater than about 200 Å, preferably about 300 Å to about 500 Å.

HSG silicon films are useful in the fabrication of capacitors to increase surface area. The art generally depicts HSG silicon in an idealized fashion having uniform grain size and distribution. However, those skilled in the art are aware that current techniques generally produce HSG silicon in which the grains are of varying size and not evenly distributed across the surface of the substrate. Non-uniformities in grain size and distribution tend to negatively impact device performance and reliability.

Figure 4B:
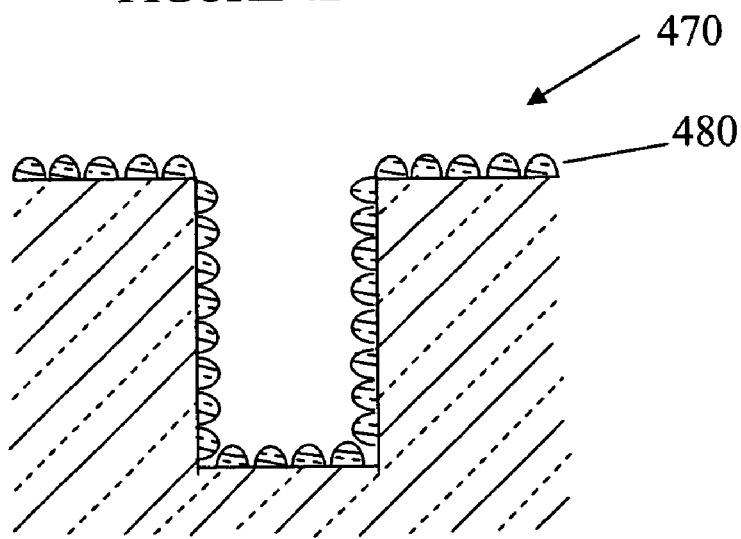
FIG. 4B illustrates HSG silicon formed by annealing the thin Si-containing film.

Thin, uniform, amorphous Si-containing films as described herein are an ideal precursor for HSG silicon. For example, FIG. 4B depicts a structure 470 in which HSG silicon film 480 is formed by annealing the silicon film 410 as shown in FIG. 4A. HSG films formed within cavities are useful in the fabrication of stacked container capacitors and trench capacitors. Similarly, stud capacitors can be formed by annealing a Si-containing film deposited onto the exterior of a post or stud, thus involving similarly challenging steps over which to deposit. Capacitors formed from HSG films are useful in a variety of applications, preferably in DRAM devices.

As DRAM devices continue to be scaled down and the sidewalls of the cavity become closer together in the horizontal direction, current HSG fabrication methods will become increasingly inadequate. Oversize grains resulting from non-uniformities in the precursor film will be more likely to come into contact, leading to electrical shorts across the cavity and consequent loss of capacitance. If future DRAM devices are to be made by depositing a silicon film within a trench or hole and annealing to form HSG silicon, then successful fabrication is likely to be facilitated by processes that allow for precise control of the morphology of the HSG silicon on the inner surfaces of deep cavities. Specifically, it would be highly desirable to be able to deposit thin, amorphous silicon films with good step coverage uniformly over steep steps, such as the inner surfaces of deep cavities, to provide films suitable for annealing to produce HSG silicon.

The ability to deposit thin, smooth Si-containing films as described herein enables the preparation of HSG silicon over structures with smaller feature sizes than when using silane, permitting extension to smaller critical dimensions. Thus, a preferred embodiment provides a method comprising introducing trisilane to a chamber, depositing an amorphous Si-containing film, and annealing the film to form HSG silicon. The chamber preferably contains a substrate at a temperature of about 450° C. to 600° C., more preferably about 450° C. to about 520° C., and an amorphous Si-containing film is deposited onto the substrate by thermal CVD. Preferably, the amorphous Si-containing film has a thickness in the range of about 10 Å to about 150 Å, preferably about 50 Å to about 100 Å, and a surface roughness of about 5 Å rms or less, preferably about 2 Å rms or less. Preferred ranges of percent thickness non-uniformity for the amorphous Si-containing film are set forth in Table 1 above. The amorphous Si-containing film is then annealed to form HSG silicon, preferably by heating to a temperature in the range of about 600° C. to about 700° C. It has been found that Si-containing films, when annealed as described, form HSG silicon having a finer and more uniform grain structure.

Average grain size and spatial distribution of HSG silicon is preferably determined by measuring the average grain size and average number of grains per given area by cross-sectioning the structure and subjecting it to transmission electron microscopy. Preferably, rms grain size is about 15% or less, preferably 10% or less, based on the average grain size. For example, for a structure having an average grain size of 300 Å, rms grain size variability is preferably 45 Å rms (15% of 300 Å) or less. Spatial uniformity is preferably determined by measuring the average number of grains per given area and the rms spatial variability. Preferably, the rms spatial variability is about 10% or less, more preferably 5% or less. For example, for a structure having an average of 25 grains per 0.1 μm$^2$, the rms spatial variability is preferably 2.5 per 0.1 μm$^2$ rms (10% of 25) or less. Average grain size is preferably about 200 Å or greater, more preferably in the range of about 250 Å to about 500 Å.

The Si-containing films described herein are also useful as anti-reflective coatings. Photolithographic processes using intense sources of electromagnetic radiation are typically employed to pattern substrates in semiconductor manufacturing. Anti-reflective coatings are frequently applied to surfaces in order to reduce the amount of reflected radiation. The coating is usually designed so that its anti-reflective properties are maximized for the type of incident radiation by adjusting the thickness of the coating to be some multiple of the wavelength of the radiation. It is generally desirable for the multiple to be as small as possible in order to avoid secondary optical effects, but it is generally more difficult to prepare such thin, optical-quality films. In addition, as device dimensions have gotten smaller, the wavelength of incident radiation used for photolithography has also become shorter, with a commensurate decrease in the desired thickness for the anti-reflective coating.

A preferred embodiment provides anti-reflective coatings useful in semiconductor manufacturing. Preferred antireflective coatings comprise a Si-containing film as described herein that has a substantially uniform thickness, more preferably a thickness non-uniformity of about 10% or less, so that the antireflective properties are substantially constant across the surface of the substrate. The thickness of the anti-reflective coating is preferably selected to be effective to suppress reflection of at least part of the incident radiation, more preferably about 75% or less of the incident radiation is reflected. Typical thicknesses are lower multiples of the wavelength of the incident radiation, preferably about 100 Å to about 4000 Å, more preferably about 300 Å to about 1000 Å. The Si-containing film preferably comprises elemental nitrogen, oxygen and/or carbon, and is more preferably selected from the group consisting of Si—N, Si—O—N, and Si—C—N. Preferred anti-reflective coatings are preferably deposited using trisilane and, optionally, an oxygen, nitrogen and/or carbon precursor, using the deposition techniques taught elsewhere herein. Preferred oxygen precursors include diatomic oxygen and ozone; preferred nitrogen precursors include hydrazine, atomic nitrogen, hydrogen cyanide, and ammonia; and preferred carbon precursors include carbon dioxide, carbon monoxide, hydrogen cyanide, alkyl silanes and silylated alkanes. Such Si—N, Si—O—N, and Si—C—N films are also useful for other purposes, preferably for thin etch stops.

In another embodiment, the Si-containing film is a Si—N film, preferably made using trisilane in combination with a nitrogen precursor to deposit thin, uniform films with compositions ranging from almost pure silicon to $Si_3N_4$. Preferred nitrogen precursors include chemical precursors such as $(H_3Si)_3N$ (trisilylamine), ammonia, atomic nitrogen, and $NF_3$. Atomic nitrogen is preferably generated using a microwave radical generator (MRG). Preferred Si—N films prepared in accordance with this embodiment have a thickness in the range of about 10 Å to about 300 Å, more preferably about 15 Å to about 150 Å. Preferred ranges of percent thickness non-uniformity for the Si—N films are set forth in Table 1 above. For thermal CVD, preferred deposition temperatures are in the range of about 400° C. to about 800° C., preferably about 400° C. to about 700° C., more preferably about 450° C. to about 650° C.

In a preferred embodiment, Si—N is deposited by introducing the nitrogen precursor, preferably atomic nitrogen, to the CVD chamber continuously, and introducing trisilane either continuously or in pulses, preferably in one or more pulses. It has been found that extremely thin, highly uniform Si—N films can be obtained by introducing each of the components, e.g., nitrogen precursor, trisilane, etc., either continuously or in pulses, but that greater film uniformity can often be obtained by introducing the trisilane in one or more pulses, especially if atomic nitrogen is introduced continuously. Preferred Si—N films have a higher degree of thickness uniformity than a comparable Si—N film deposited using silane in place of trisilane, more preferably a film surface roughness that is greater than the substrate surface roughness by an amount of about 10 Å rms or less, most preferably by an amount of about 5 Å rms or less, over a surface area of about 1 square micron or greater.

The use of preferred nitrogen precursors as chemical precursors in conjunction with trisilane, especially at low temperatures, enables the deposition of Si—N materials with a minimal number of N—H bonds in the thin film at deposition rates much higher than those afforded by processes which employ traditional Si sources such as silane. For deposition temperatures in excess of 450° C., hydrogen content is preferably less than about 4 atomic %, more preferably less than about 2 atomic % and most preferably less than about 1 atomic %.

Such thin, uniform silicon nitride films have a variety of applications. In the semiconductor fabrication field, for example, Si—N is often employed as an etch stop, CMP stop, hard mask, barrier layer, capacitor dielectric, gate dielectric, etc. In all of these applications, forming as thin as possible a layer with complete continuity is advantageous.

Figure 8:
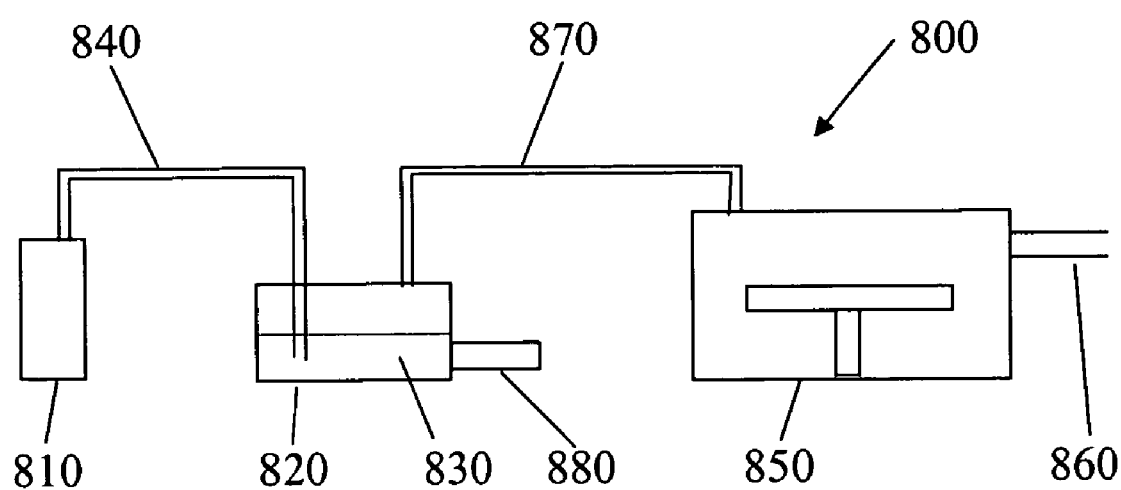

An apparatus is provided for depositing a Si-containing material on a surface. A schematic diagram illustrating a preferred apparatus is shown in FIG. 8. This apparatus 800 comprises a carrier gas source 810, a temperature controlled bubbler 820 containing liquid trisilane 830, and a gas line 840 operatively connecting the gas source 810 to the bubbler 820. A CVD chamber 850, equipped with an exhaust line 860, is operatively connected to the bubbler 820 by a feed line 870. The flow of trisilane, entrained in the carrier gas, from the bubbler 820 to the CVD chamber 850, is preferably aided by a temperature regulation source 880 operatively disposed in proximity to the bubbler. The temperature regulation source 880 maintains the trisilane 830 at a temperature in the range of about 10° C. to about 70° C., preferably about 20° C. to about 52° C., to thereby control the vaporization rate of the trisilane. Preferably, the CVD chamber 850 is a single-wafer, horizontal gas flow reactor. Preferably, the apparatus is also comprised of a manifold (not shown) operatively connected to the feed line 870 to control the passage of the trisilane 830 from the bubbler 820 to the CVD chamber 850, desirably in a manner to allow separate tuning of the gas flow uniformity over the substrate(s) housed in the chamber 850. Preferably, the gas line 870 is maintained at a temperature in the range of about 35° C. to about 70° C., preferably about 40° C. to about 52° C., to prevent condensation of the trisilane.

In another preferred embodiment, integrated circuits are provided, comprised of a Si-containing film such as described herein. Methods for making such integrated circuits from Si-containing films are known to those skilled in the art. The use of trisilane enables the extension of current device designs to smaller critical dimension by virtue of the fact that thinner films can be controllably deposited at commercially meaningful deposition rates. These integrated circuits may be incorporated into computer systems by methods known to those skilled in the art and thus a further preferred embodiment provides a computer system comprised of one or more of such integrated circuits. As used herein, "computer system" includes silicon-based devices capable of performing calculations and/or storing information in digital form. "Computer system" thus includes any device into which an integrated circuit may be incorporated.

The methods described herein can increase semiconductor manufacturing device yield. Semiconductor device manufacturing generally involves starting with a wafer substrate having a surface area of about 300 $cm^2$ or greater, e.g., a wafer having a diameter of 200 or 300 millimeters or even larger. The wafer is subjected to dozens, hundreds, or even thousands of processing steps to produce a finished wafer that comprises millions of semiconductor devices. The finished wafer is then cut to separate the devices from one another, producing a total number $N_T$ of completed semiconductor devices.

It is highly desirable for each step in the manufacturing process to be as uniform as possible so that all of the completed semiconductor devices have the desired performance characteristics. However, it is often the case that the process produces a number $N_A$ of acceptable devices, i.e., devices that meet the desired performance specifications, and a number $N_U$ of unacceptable devices that do not meet the specifications. Since the unacceptable devices must frequently be scrapped, the device yield for a particular process, $N_A/N_T$, is a parameter that is usually very important to the manufacturer.

Many semiconductor device manufacturing processes have manufacturing steps in which a Si-containing film is deposited onto a substrate using silane. However, with the ongoing trend toward larger wafers and more compact devices, it is becoming increasingly difficult to maintain device yields because of the aforementioned problems associated with the use of silane. For example, with the deposition of thinner Si-containing layers, it is becoming increasingly difficult to tune the process to compensate for thickness and/or compositional variations across the surface of the wafer, particularly for larger wafers.

The yield of a semiconductor device manufacturing process that utilizes silane can be improved by replacing the silane with trisilane, as described herein. Although the replacement may improve yields in a variety of processes, it has particular utility when the process involves depositing a Si-containing film having an average thickness of about 2000 Å or less, and becomes increasingly preferred as film thickness is decreased. Thus, the replacement is useful for depositing films having a thickness of about 300 Å or less, even more useful for depositing films having a thickness of about 150 Å or less, and especially useful when for depositing films having a thickness of about 100 Å or less. Likewise, the replacement is particularly useful for improving yields when the surface area of the substrate is about 300 cm² or greater; and even more so when the surface area is about 700 cm² or greater.

Since the value of individual semiconductor devices is often quite high, even small increases in yield can result in significant cost savings for the manufacturer. Preferably, the replacement of silane with trisilane improves device yield by about 2% or more, more preferably about 5% or more, calculated as [trisilane device yield−silane device yield]/silane device yield, and multiplying by 100 to express the result as a percentage.

A preferred replacement method involves modifying a CVD process to take advantage of the ability to deposit trisilane at a lower temperature, e.g., using the temperature parameters discussed above for the thermal CVD of trisilane. For example, where the semiconductor device manufacturing process comprises thermal CVD of silane at a temperature $T_s$, the replacement of silane with trisilane preferably further involves reducing the deposition temperature to $T_t$, where $T_s > T_t$. Such temperature reductions advantageously conserve thermal budgets, and are preferably about 10% or greater, more preferably about 20% or greater, calculated as $(T_s-T_t)/T_s$, and multiplying by 100 to express the result in percentage terms. Preferably, $T_t$ is in the range of about 450° C. to about 600° C., more preferably in the range of about 450° C. to about 525° C. Preferably, the process of introducing silane to the chamber is also modified when replacing the silane with trisilane to take into account the liquid nature of trisilane at room temperature as discussed above, e.g., by using a bubbler, heated gas lines, etc.

EXAMPLES

The following experiments were carried out using an ASM Epsilon E2500™ horizontal flow reactor system, configured with a Bernoulli wand wafer transfer system, purge-only load locks, a concave susceptor with grooves in the top surface to prevent wafer slide upon drop-off, a square pre-heat ring, adjustable spot lamps and independently tunable gas inlet injectors.

Example 1

An eight-inch diameter (200 mm) <100> silicon wafer substrate having a 1,000 Å SiO₂ layer was placed into the reactor chamber and allowed to reach thermal equilibrium at 450° C. at 40 Torr pressure under a flow of 20 standard liters per minute (slm) of high purity hydrogen gas. Trisilane was introduced to the chamber by passing high purity hydrogen gas through liquid trisilane using a bubbler (maintained at room temperature using a water bath around the vessel containing the trisilane) connected by a feed line to the chamber. A flow rate of 180 standard cubic centimeters per minute (sccm) of the hydrogen/trisilane mixture, along with a flow of 90 sccm (inject) of diborane (100 ppm, 90 sccm mixed with 2 slm high purity hydrogen), was then passed into the reactor for four minutes. A continuous, boron-doped, amorphous silicon film having a total thickness of 56 Å and a surface roughness of about 2 Å rms (comparable to the underlying silicon dioxide) was deposited on the silicon dioxide layer at a deposition rate of 14 Å per minute. A layer of epoxy was then applied to facilitate cross-sectional sample preparation.

Figure 9:
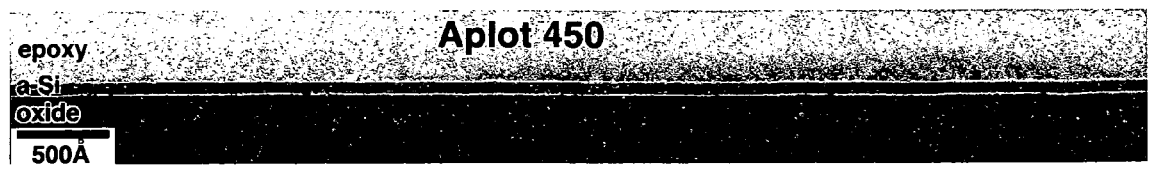

FIG. 9 is reproduction of an electron micrograph showing a cross section of the resulting substrate showing the underlying SiO₂ layer ("oxide"), the deposited amorphous silicon film ("a-Si"), and the overlying epoxy layer ("epoxy"). Furthermore, nucleation over oxide is sufficiently fast as to enable deposition in four minutes or less, even with pressures in the range of 1 Torr to 100 Torr and temperatures in the range of 425° C. to 525° C.

Example 2 (Comparative)

The process of Example 1 is repeated except that silane is used instead of trisilane. Since silane is a gas under the experimental conditions, it was introduced to the chamber directly in admixture with hydrogen, without the use of a bubbler. No meaningful deposition was observed after 30 minutes and no Si-containing film was obtained even with a silane flow of 190 sccm.

Example 3

The process of Example 1 was repeated, except that the flow rate was 228 sccm, diborane was not used, and the deposition time was two minutes. A continuous amorphous silicon film having a total thickness of 28 Å and a surface roughness of about 2 Å rms (comparable to the underlying silicon dioxide) was deposited on the silicon dioxide layer at a deposition rate of 14 Å per minute. A layer of epoxy was then applied to facilitate cross-sectional sample preparation.

Figure 10:
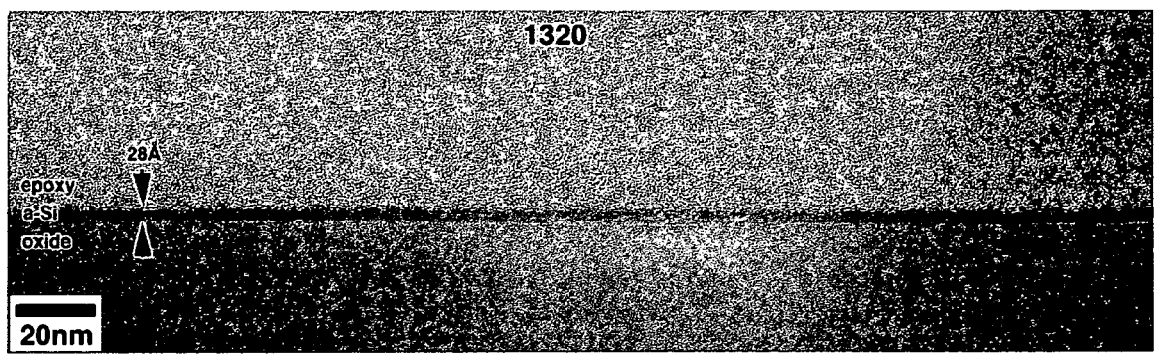

FIG. 10 is reproduction of an electron micrograph showing a cross section of the resulting substrate showing the underlying SiO₂ layer ("oxide"), the deposited amorphous silicon film ("a-Si"), and the overlying epoxy layer ("epoxy"). This example illustrates the deposition of an extremely thin, continuous, uniform amorphous silicon film in the absence of a dopant or dopant precursor. Furthermore, nucleation over oxide is sufficiently fast as to enable deposition in two minutes or less, even with pressures in the range of 1 Torr to 100 Torr and temperatures in the range of 425° C. to 525° C.

Example 4

An eight-inch diameter (200 mm) <100> silicon wafer substrate having a 1,000 Å SiO₂ layer was placed into the reactor chamber and allowed to reach thermal equilibrium at 600° C. at 40 Torr pressure under a flow of 20 standard liters per minute (slm) of high purity hydrogen gas. Trisilane was introduced to the chamber by passing high purity hydrogen gas through liquid trisilane using a bubbler (maintained at room temperature using a water bath around the vessel containing the trisilane) connected by a feed line to the chamber. A flow rate of 180 standard cubic centimeters per minute (sccm) of the hydrogen/trisilane mixture, along with a flow of 90 sccm (inject) of diborane (100 ppm, 90 sccm mixed with 2 slm high purity hydrogen), was then passed into the reactor for 15 seconds to deposit an amorphous boron-doped silicon film having a thickness of 100 Å. Under these conditions, the delivery rate of trisilane to the substrate was about 0.1 gram per minute. The deposition rate was 400 Å per minute.

Example 5

An amorphous boron-doped silicon film was deposited as described in Example 4, except that deposition was carried out for 30 seconds to produce a film having a total thickness of 205 Å. The deposition rate was 410 Å per minute.

Example 6

An amorphous boron-doped silicon film was deposited as described in Example 4, except that deposition was carried out for one minute to produce a film having a total thickness of 409 Å. The deposition rate was 409 Å per minute.

Examples 4-6 demonstrate that deposition rates were essentially constant when trisilane was used to deposit thin films. The average deposition rate was 406 Å/minute and the variability was only 4.5 Å/min rms (1.1%).

Example 7 (Comparative)

An amorphous boron-doped silicon film was deposited as described in Example 4, except that trisilane was used instead of silane. Silane was supplied in the form of a gas at a flow rate of about 100 sccm. A bubbler was not used because silane is a gas under these conditions. The delivery rate of silane to the substrate was about 0.1 gram per minute, about the same as the delivery rate of trisilane in Examples 4-6. Deposition was carried out for three minutes to produce a film having a total thickness of 16 Å. The deposition rate was 5.3 Å per minute.

Example 8 (Comparative)

An amorphous boron-doped silicon film was deposited as described in Example 7, except that deposition was carried out for five minutes to produce a film having a total thickness of 87 Å. The deposition rate was 17.4 Å per minute.

Example 9 (Comparative)

An amorphous boron-doped silicon film was deposited as described in Example 7, except that deposition was carried out for ten minutes to produce a film having a total thickness of 284 Å. The deposition rate was 28.4 Å per minute.

Examples 7-9 demonstrate that deposition rates varied significantly, depending on film thickness, when silane was used to deposit thin films. The deposition rate changed from 5.3 Å per minute to 28 Å per minute as the film thickness increased from 16 Å to 284 Å. The average was 17 Å/minute and the variability was 9.4 Å rms (55%).

Examples 4-9 demonstrate that the use of trisilane instead of silane allows for deposition to be conducted at much higher rates and with vastly improved film deposition uniformity.

Example 10

A thin, uniform, continuous Si—N film having a thickness of about 39 Å was deposited at 650° C. at a pressure of 3 Torr onto a p-type Si <100> substrate (etched with HF, but not baked) using trisilane and atomic nitrogen. Atomic nitrogen was generated remotely using a commercially available 800 watt microwave radical generator (MRG) and was supplied to the CVD chamber using a nitrogen flow rate of about 6 slm. Trisilane was supplied to the CVD chamber via a bubbler with a nitrogen carrier gas at a flow rate of about 50 sccm (bubbler). The trisilane was introduced in a series of six pulses, each lasting about 6 seconds, at intervals of about 1 minute and 30 seconds, during which the atomic nitrogen was introduced continuously.

Figure 11:
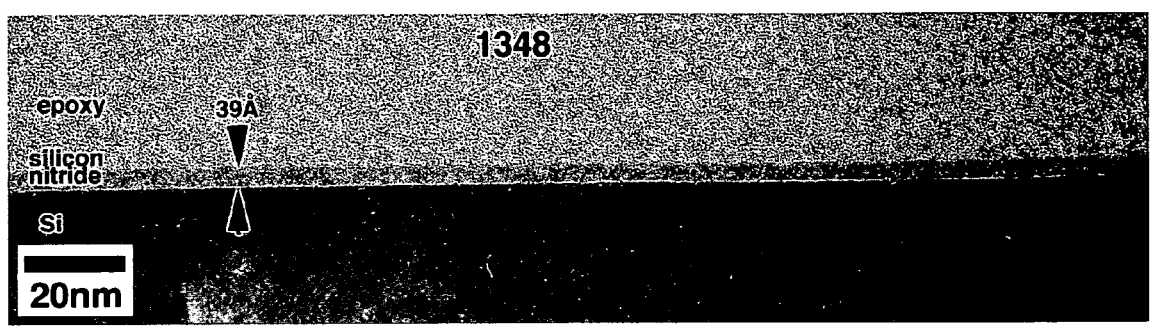

The resulting Si—N film was coated with epoxy, cross-sectioned and imaged using transmission electron microscopy (TEM), as shown in the TEM photomicrograph of FIG. 11. The film/substrate surface was found to be essentially free of native oxide and is evidently extremely uniform and smooth.

It will be appreciated by those skilled in the art that various omissions, additions and variations may be made to the compositions and processes described above without departing from the scope of the invention, and all such modifications and changes are intended to fall within the scope of the invention, as defined by the appended claims.

We claim:

1. A method of increasing device yield in a semiconductor device manufacturing process, comprising:
   introducing trisilane to a chamber, wherein the chamber contains a substrate having a surface area of about 300 cm$^2$ or greater;
   establishing trisilane chemical vapor deposition conditions in the chamber;
   depositing a Si-containing film onto the substrate, wherein the Si-containing film has an average thickness of about 2000 Å or less; and
   determining the device yield in the semiconductor device manufacturing process, wherein the device yield is equal to $N_A/N_T$, wherein $N_T$ is a total number of semiconductor devices on the substrate, and $N_A$ is a number of the devices that are acceptable, and wherein the device yield is greater than when silane is used in place of said trisilane.

2. The method of claim 1, wherein the semiconductor device manufacturing process further comprises using a bubbler to introduce the trisilane to the chamber.

3. The method of claim 2, wherein the bubbler is temperature-regulated.

4. The method of claim 1, wherein the Si-containing film has an average thickness of about 300 Å or less.

5. The method of claim 1, wherein the Si-containing film has an average thickness of about 150 Å or less.

6. The method of claim 1, wherein the substrate has a surface area of about 700 cm$^2$ or greater.

7. The method of claim 1, wherein the device yield is at least about 2% greater than when silane is used in place of said trisilane.

8. The method of claim 1, wherein the device yield is about 5% greater than when silane is used in place of said trisilane.

* * * * *